United States Patent
Sheffield (10) Patent No.: US 8,522,174 B2
(45) Date of Patent: Aug. 27, 2013

(54) SEMICONDUCTOR MEMORY

(75) Inventor: Bryan David Sheffield, Austin, TX (US)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 13/362,117

(22) Filed: Jan. 31, 2012

(65) Prior Publication Data

US 2012/0324413 A1    Dec. 20, 2012

Related U.S. Application Data

(60) Provisional application No. 61/497,193, filed on Jun. 15, 2011.

(51) Int. Cl.
*G06F 17/50* (2006.01)
(52) U.S. Cl.
USPC .................................... 716/100; 716/101
(58) Field of Classification Search
USPC .................................. 716/132–136
See application file for complete search history.

(56) References Cited

U.S. PATENT DOCUMENTS

| 6,560,139 | B2 | 5/2003 | Ma et al. |
| 8,266,571 | B2* | 9/2012 | Chapman et al. ............. 716/136 |
| 2001/0006477 | A1* | 7/2001 | Banks ...................... 365/185.03 |

* cited by examiner

*Primary Examiner* — Binh Tat
(74) *Attorney, Agent, or Firm* — Duane Morris LLP (57) ABSTRACT

A method includes simulating a first design of a semiconductor memory that includes at least one device disposed between and coupled to a memory bit cell and to a power supply line, determining if at least one simulated operational value of the semiconductor memory is above a threshold value, and adjusting at least one of a size of the device or a type of the device if the at least one simulated operational value is below the threshold value. The memory bit cell is disposed in a column including a plurality of bit cells. The size or type of the device is repeatedly adjusted and the design of the semiconductor memory is repeatedly simulated until the at least one simulated operational value is at or above the threshold value.

19 Claims, 6 Drawing Sheets

SEMICONDUCTOR MEMORY

CROSS REFERENCE TO RELATED APPLICATIONS

This application claims priority to U.S. Patent Application No. 61/497,193, filed Jun. 15, 2011, the entirety of which is herein incorporated by reference.

FIELD OF DISCLOSURE

The disclosed system and method relate to integrated circuit memories. More particularly, the disclosed system and method relate to SRAM arrays.

BACKGROUND

Static random access memories ("SRAM") include a plurality of cells disposed in rows and columns to form an array. Conventional SRAM cells include a plurality of transistors coupled to bit lines and word lines that are used to read and write a bit of data to the memory cell. As the size of SRAM cells continues to decrease, the supply voltage VCC is typically lowered. Lowering the supply voltage reduces the amount of read current, which results in the leakage current being larger relative to the read current. This increase in the leakage current compared to the read current results in difficulty in accurately reading data from the memory cell.

DETAILED DESCRIPTION

The disclosed circuits, systems, and methods enable the number of memory bit cells (rows of memory bit cells) in a column to be increased by reducing the leakage current experienced on a bit line. Reducing the leakage current and increasing the number of rows of memory bit cells in a column advantageously increases the density and efficiency of the semiconductor memory. In some embodiments, the number of rows in a column of the semiconductor memory may be increased to more than 256 rows. For example, the number of rows in a column may be extended up to and beyond 512 rows.

Figure 1A:
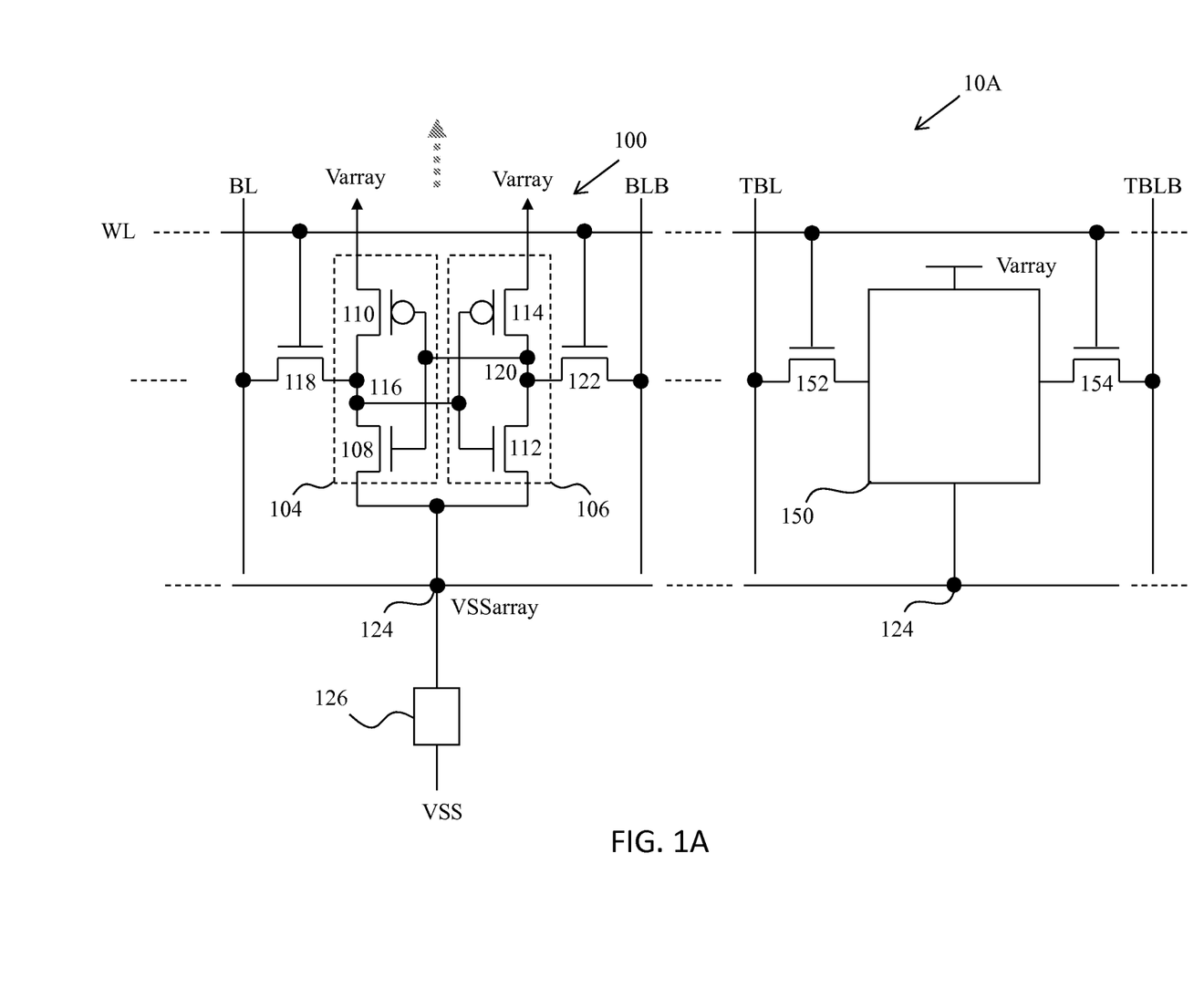
FIG. 1A is a circuit diagram of one example of an improved bit cell of a semiconductor memory.

FIG. 1A is a partial view of a semiconductor memory 10A including a memory cell 100 including a latch 102 formed by a pair of cross-coupled inverters 104 and 106. Inverter 104 includes an NMOS transistor 108 coupled in series with a PMOS transistor 110, and inverter 106 includes an NMOS transistor 112 coupled in series with a PMOS transistor 114. Storage node 116 is disposed between transistors 108 and 110 and is coupled to a source of pass transistor 118 and to the gates of transistors 112 and 114. Storage node 120 is coupled to the source of pass transistor 122 and to the gates of transistors 108 and 110.

Pass transistor 118 has its gate coupled to the word line ("WL") and its drain coupled to the bit line ("BL"). The gate of pass transistor 122 is also coupled to WL, and the drain of pass transistor is coupled to the complementary bit line BLB. The source of PMOS transistors 110 and 114 are coupled to the array voltage, Varray, and the source of NMOS transistors is coupled to node 124. A device 126, which may be passive or active, is coupled to node 124 and to VSS for increasing the voltage at node 124. In some embodiments, device 126 is an NMOS transistor having a source coupled to VSS and a gate coupled to a voltage source node having a voltage sufficient to maintain the NMOS transistor in an 'on' or current conducting state. In some embodiments, device 126 may be a voltage controlled voltage source, a resistor or device to increase the voltage at node 124.

In embodiments in which device 126 is implemented as an NMOS transistor, the NMOS transistor may be formed in accordance with the process for fabricating the bit cell transistors, or the NMOS transistor may be fabricated in accordance with fabricating the standard logic transistors used for memory and control circuitry depending on the goals for a particular implementation. For example, forming device 126 using a logic fabrication method has been found to advantageously improve the dynamic power and timing variability of the semiconductor memory.

For example, if the bit cell transistors happen to fabricate on the strong side of the manufacturing specification window and logic transistors are at the side of the manufacturing specification window, then by using a logic device for shunt device 126, the strong bit cell read current is essentially throttled down by transistor 126 more than it would be if transistor 126 was fabricated as a bit cell transistor. The reduction in bit cell read current helps minimize an over-read condition which occurs when bit cell transistors are strong relative to the logic transistors used for timing control. When bit cell transistors are strong relative to logic transistors, bit line voltage swings are greater than what is required for reading, which wastes subsequent bit line recharging, e.g., pre-charging, power. Additionally, if bit cell transistors are integrated into the timing control logic to improve logic versus bit cell timing tracking, then the effect described above also reduces variations between the clock, CLK, to output timing.

Alternatively, forming shunt transistor 126 using the bit cell fabrication method may offer advantages depending on the particular goals and/or requirements of the application. For example, if transistor 126 is formed using the same process used to form bit cells, then the systematic strength or weakness of transistor 126 will have a greater positive correlation to the strength or weakness of the bit cells used to form the memory array. When the array of bit cells happen to be at the strong side of the processing window, which correlates to maximum array leakage, then transistor 126 will also be near the strong side of the process window. Consequently, transistor 126 is a relatively strong device and is able to sink the increased array leakage current without a substantial voltage rise on VSSarray from VSS.

A similar but opposite effect occurs when both array bit cells and transistor 126 are at the weak side of the processing window. Even though the array leakage is small at the weak processing corner, the transistor 126 is also a weaker device resulting in VSSarray staying at a higher voltage. Forming transistor 126 using the same fabrication method used to fabricate bit cells provides a negative feedback mechanics that narrows the range of voltage rise on VSSarray, which is advantageous in implementations in which tight control of the array voltage is needed.

A tracking bit cell 150 is respectively coupled to a tracking bit line ("TBL") and to its complementary bit line ("TBLB") through transistors 152 and 154. Transistor 152 has its gate coupled to WL, its source coupled to tracking bit cell 150, and its drain coupled to TBL. Transistor 154 has its gate coupled to WL, its source coupled to tracking bit cell 150, and its drain coupled to TBLB. Tracking bit cell 150 is coupled to a first voltage supply rail having a voltage set at Varray and to node 124, which is set at VSSarray. Coupling the tracking bit cell 150 to VSSarray instead of to VSS advantageously enables the control circuitry (not shown) that controls the timing of semiconductor memory 10A to more accurately assess the speed at which semiconductor memory 10A is operating and to adjusting the timing accordingly.

Figure 1B:
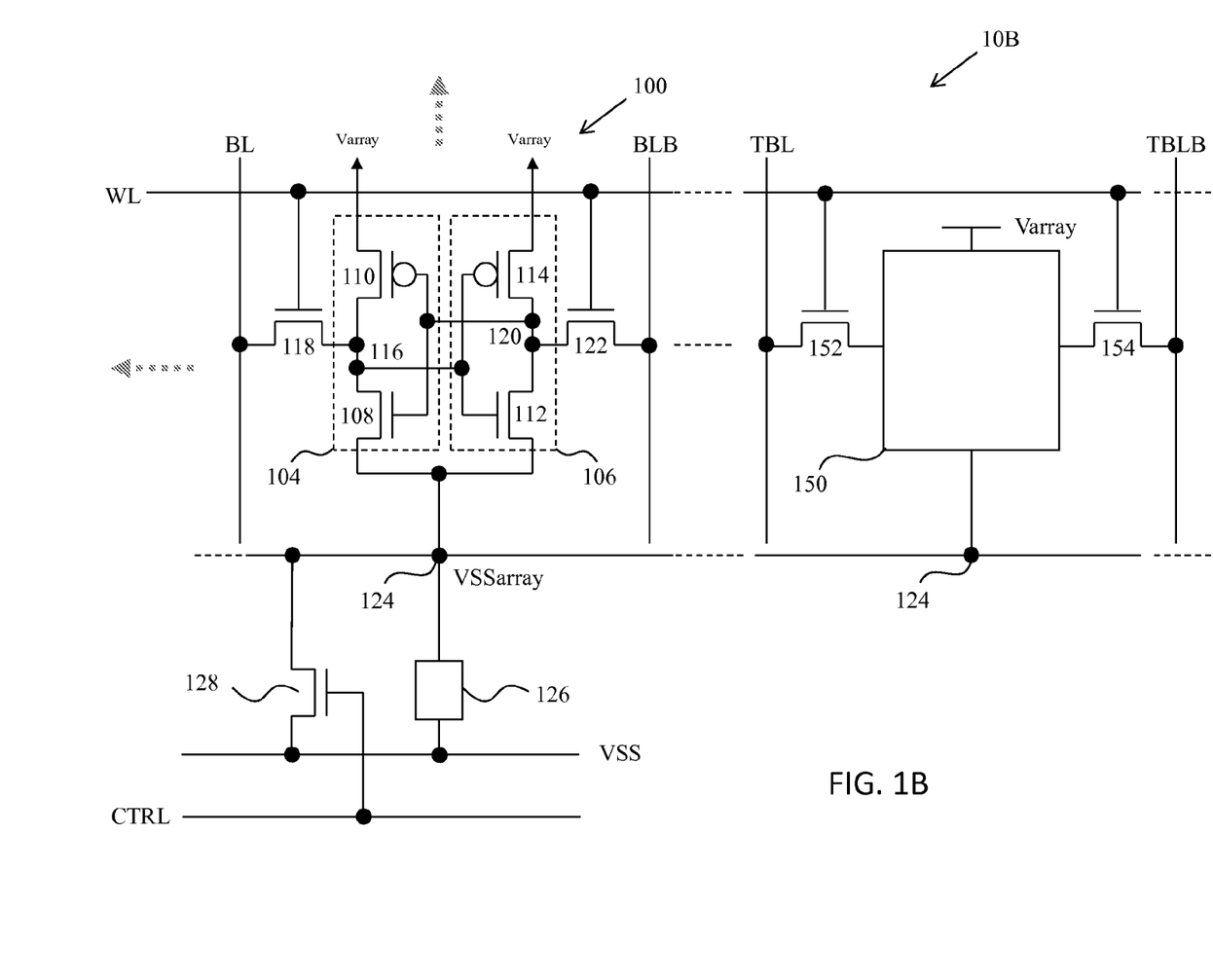
FIG. 1B is a circuit diagram of another example of an improved bit cell of a semiconductor memory.

FIG. 1B illustrates another example of an semiconductor memory 10B including a bit cell 100 and a tracking bit cell 150. As shown in FIG. 1B, bit cell 100 includes a latch 102 comprising a pair of cross-coupled inverters 104 and 106. Inverter 104 includes an NMOS transistor 108 coupled in series with a PMOS transistor 110, and inverter 106 includes an NMOS transistor 112 coupled in series with a PMOS transistor 114. Storage node 116 is disposed between transistors 108 and 110 and is coupled to a source of pass transistor 118 and to the gates of transistors 112 and 114. Storage node 120 is coupled to the source of pass transistor 122 and to the gates of transistors 108 and 110.

Pass transistor 118 has its gate coupled to WL and its drain coupled to BL. The gate of pass transistor 122 is also coupled to WL, and the drain of pass transistor is coupled to BLB. The source of PMOS transistors 110 and 114 are coupled to the array voltage, Varray, and the source of NMOS transistors is coupled to node 124. Device 126, which may be passive or active, is coupled to node 124 and to VSS for increasing the voltage at node 124. In some embodiments, device 126 is an NMOS transistor having a source coupled to VSS and a gate coupled to a voltage source node having a voltage sufficient to maintain the NMOS transistor in an on state. As described above, the NMOS transistor may be formed in accordance with the process for fabricating the bit cell transistors, or the NMOS transistor may be fabricated in accordance with fabricating the transistors for logic and control circuitry. In some embodiments, device 126 may be a voltage controlled voltage source, a resistor or device to increase the voltage at node 124.

An NMOS transistor 128 is coupled in parallel with device 126 such that it has its drain coupled to node 124 and its source coupled to VSS. The gate of transistor 128 is coupled to a control line, CTRL, which controls the turning on and off of transistor 128. In some embodiments, CTRL is configured to turn on transistor 128 when the WL is asserted high and to turn off transistor 128 when the WL is asserted low. Such an embodiment may be implemented by coupling CTRL to WL, although one skilled in the art will understand that CTRL may be coupled to a timing or control circuit configured to turn on transistor 128 when WL is at a high voltage and turn off transistor 128 when WL is at a low voltage. The inclusion of transistor 128 further assists in reducing the effective resistance, when turned on, between VSSarray and VSS, thereby lowering VSSarray closer to VSS.

Lowering VSSarray reduces degradation in the read current path through a bitcell 106 (e.g., the path through transistors 108 and 118 or through transistors 112 and 122) as a higher VSSarray reduces the bitcell read current and thus performance. In embodiments in which transistor 126 is optimized for leakage reduction by allowing for a greater voltage rise on VSSarray, transistor 128, being coupled to WL as discussed above, can be turned on during the active WL duration to sink the bitline charge which is coupled to the VSSarray node by on transistors 118 and 122. Sinking the bit line charge prevents what might otherwise be an undesirable dangerous rise in VSSarray voltage producing cell instability issues and possible data loss. Such optimization may affect the read current of bitcell 106 due to the elevated cell pull-down source node of transistors 108 and 112.

In another embodiment, it may be advantageous to use transistor 128 to overcompensate for the additional bitcell read current (due to 'on' WL) thus lowering the VSSarray voltage to a value lower than the quiescent state voltage, but still higher than VSS, for the purpose of improving bitcell read current and thus performance resulting from reduced voltage difference between VSSarray and VSS.

Semiconductor memory 10B also includes at least one tracking bit cell 150 coupled to tracking bit line TBL through transistor 152 and to TBLB through transistor 154. Transistor 152 has its gate coupled to tracking WL, TWL, its source coupled to tracking bit cell 150, and its drain coupled to TBL. Transistor 154 has its gate coupled to TWL, its source coupled to tracking bit cell 150, and its drain coupled to TBLB. Tracking bit cell 150 is coupled to a first voltage supply rail having a voltage set at Varray and to node 124, which is set at VSSarray. Coupling the tracking bit cell 150 to VSSarray instead of to VSS advantageously enables the control circuitry (not shown) that controls the timing of semiconductor memory 10B to more accurately assess the speed at which semiconductor memory 10B is operating and to adjusting the timing accordingly.

For example, by coupling the VSSarray nets of all columns to a single VSSarray net, an averaged VSSarray value is produced that provides a uniform impact on read current throughout the entire array. Routing the VSSarray net into the memory control circuit enables the timing circuitry to access the VSSarray net to make global timing adjustments. The common VSSarray net may then be used to as the VSS reference for the timing circuits that control the read sense amplifier (not shown). A sense enable may then be delayed by a factor that corresponds to the reduced read current in the bit cell.

The use of VSSarray in the tracking circuit enables integrated circuits that may sit at a weak process corner (typically having a lower array leakage and a VSSarray voltage that is closer to VSS) to have less margin, which results in better performance. Similarly, integrated circuits sitting in a strong process corner (typically having a higher leakage and a VSSarray voltage that is higher than VSS) to have a higher margin; however, the integrated circuit will be fast compared to other process corners, and the increased margin will not set the performance limit of the design.

Figure 2A:
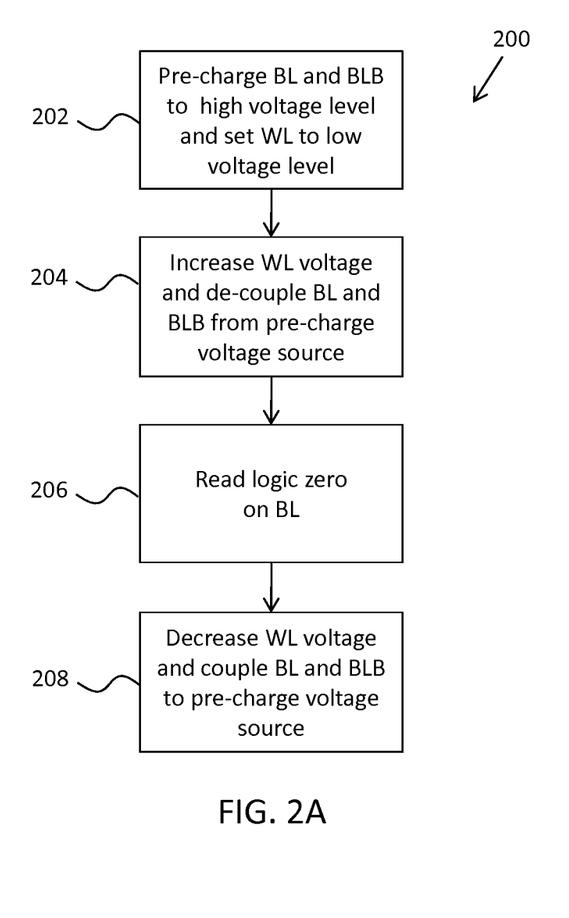
FIG. 2A is a flow diagram of one example of reading a logic zero from a memory bit cell in accordance with FIG. 1A.

The reading of a logic zero from storage node 116 of bit cell 100 is described with reference to FIG. 2A, which is a flow diagram of one example of a method of reading a logic zero from a semiconductor memory 10A. At block 202, bit lines BL and BLB are pre-charged to a logic one or a high voltage level, e.g., VDD, by a pre-charge voltage source (not shown), and WL is at a low voltage level, i.e., VSS. With the WL set at approximately VSS, pass transistors 118 and 122 are in a non-current conducting or 'off' state since their gate-source voltage, $V_{GS}$, is less than the turn-on voltage, $V_T$.

The inclusion of device 126 between node 124 and VSS causes a rise in the voltage of VSSarray (caused by the effective resistance of device 126 and leakage current from the array), which is then coupled to the source of transistors 118 or 122 by means of the 'on' transistor 108 or 112, respectively. This results in the source nodes of transistor 108 (or 112 depending on the bitcell state) being at a higher voltage (VSSarray) relative to the word line voltage resulting in an effective reversed bias gate-source voltage (Vgs) state to drive the transistor deeper into the subthreshold 'off' state thereby reducing leakage based on the transistor subthreshold conduction slope. For example, if a logic zero is stored at storage node 116, then the voltage of node 116 is VSSarray, which is greater than VSS, and the voltage of node 120 is at VDD. Since VSSarray is greater than VSS, then transistor 118 is more off, i.e., less current flows through the channel of transistor 118, than if the voltage at node 116 was at VSS. Less current flowing through the channel of transistors 118 and 122 results in a lower leakage current on BL and BLB.

At block 204, the voltage on WL is increased to VDD to turn on pass transistors 118 and 122, and BL and BLB are decoupled from the pre-charge voltage source (not shown). Decoupling BL and BLB and turning on pass transistors 118 and 122 couples bit lines BL an BLB to the internal bit cell storage nodes 116 and 120.

At block 206, the voltages of the storage nodes 116 and 120 respectively develop on BL and BLB. For example, the logic zero stored at node 116 results in BL being pulled to a logic zero due to current passing from BL to node 116 through transistor 118 and the logic one stored at node 120 results in BLB remaining at its high precharge value due to no discharge path to VSSarray.

The reading operation ends at block 208 when the WL transitions from a logic one to a logic zero to turn off pass transistors 118 and 122. The BL and BLB are re-coupled to the pre-charge voltage source that places a high voltage on BL and BLB.

Figure 2B:
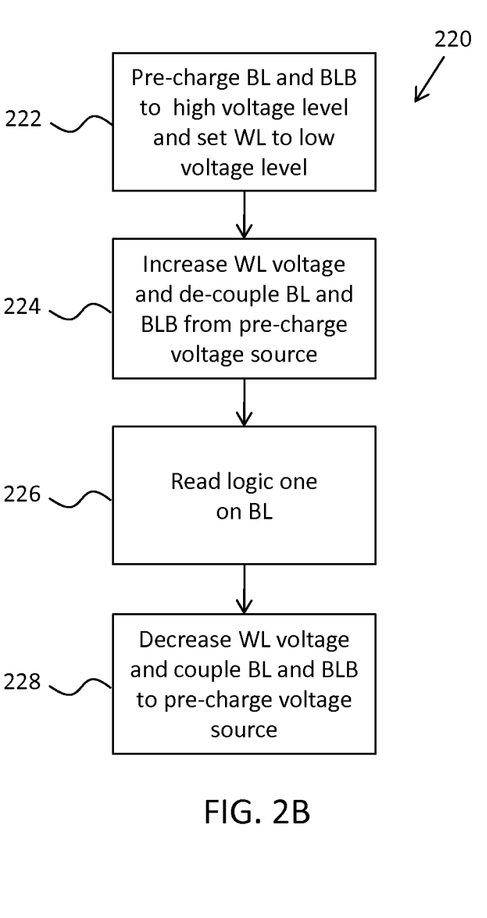
FIG. 2B is a flow diagram of one example of reading a logic one from a memory bit cell in accordance with FIG. 1A.

FIG. 2B is a flow diagram of one example of a method 220 of reading a logic one from storage node 116 of bit cell 100. At block 222, bit lines BL and BLB are pre-charged to high voltage levels, e.g., VDD, by the pre-charge voltage source (not shown), and WL is at a low voltage level, i.e., VSS. With the WL set at approximately VSS, pass transistors 118 and 122 are off due to their gate-source voltages, $V_{GS}$, being less than the turn-on or threshold voltages, $V_T$. Device 126 between node 124 and VSS increases the voltage of nodes 116 and 120 relative to VSS and results in the channel of pass transistors 118 and 122 being more off than if the voltage at nodes 116 and 120 were coupled to VSS. For example, if a logic zero is stored at storage node 120, then the voltage of node 120 is VSSarray, which is greater than VSS, and the voltage of node 116 is at VDD. Since VSSarray is greater than VSS, then transistor 122 is more 'off' than if the voltage at node 120 was at VSS due to the negative Vgs voltage.

At block 224, the voltage on WL is increased to VDD to turn on pass transistors 118 and 122, and BL and BLB are decoupled and turning on pass transistors 118 and 122 couples bit lines BL an BLB to the internal bit cell storage nodes 116.

At block 226, the voltages of the storage nodes 116 and 120 respectively develop on BL and BLB. For example, the logic one stored at node 116 stays at the same voltage level since bit line BL is precharged to a logic one, and the logic zero stored at node 120 pulls BLB down to a logic one as current passes from BLB to node 120 through transistor 122.

The reading operation ends at block 228 when the WL transitions from a logic one to a logic zero to turn off pass transistors 118 and 122. The BL and BLB are re-coupled to the pre-charge voltage source that places a high voltage on BL and BLB.

Figure 2C:
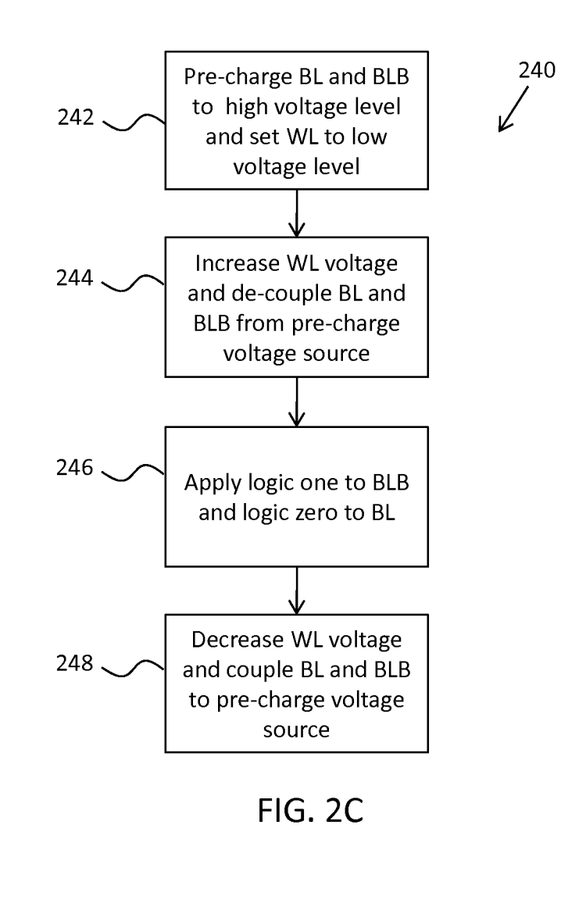
FIG. 2C is a flow diagram of one example of writing a logic zero to a memory bit cell in accordance with FIG. 1A.

The writing of a logic zero to node 116, which is equivalent to write a logic one to node 120, is described with reference to FIG. 2C, which is a flow diagram of one example of a method 240 of such operation. At block 242, bit lines BL and BLB are pre-charged to high voltage levels, e.g., VDD, by the pre-charge voltage source (not shown), and WL is at a low voltage level, i.e., VSS. With the WL set at approximately VSS, pass transistors 118 and 122 are off due to their gate-source voltages, $V_{GS}$, being less than the turn-on or threshold voltages, $V_T$. Device 126 between node 124 and VSS increases the voltage of nodes 116 and 120 relative to VSS and results in the channel of pass transistors 118 and 122 being more off than if the voltage at nodes 116 and 120 were coupled to VSS. For example, if a logic zero is stored at storage node 120, then the voltage of node 120 is VSSarray, which is greater than VSS, and the voltage of node 116 is at VDD. Since VSSarray is greater than VSS, then transistor 122 is more 'off' than if the voltage at node 120 was at VSS.

At block 244, the voltage on WL is increased to VDD to turn on pass transistors 118 and 122, and BL and BLB are decoupled from the pre-charge voltage source (not shown).

At block 246, BL is driven to a logic zero by the control logic (not shown), which is coupled to storage node 116 through pass transistor 1118. The writing of the logic zero to node 116 is assisted by the voltage at storage node 120 initially being elevated compared to VSS, i.e., being at voltage VSSarray. This results in a reduced Vgs for transistor 110, thus weakening the stored one logic state. Additionally, node 120 being elevated compared to VSS also weakens the stored zero side of the bitcell due to the reduced drive current of transistor 112 from a reduced Vgs value and also from an increased threshold voltage (Vt) caused by an elevated source compared to the bulk node (body effect). As a result, the voltage at storage node 120 being elevated compared to VSS enables the writing of a logic one to storage node 120 to be performed more quickly and/or over an increased range of power rail voltages, compared to having VSS stored at storage node 120.

The write of a logic zero at node 116 results in storage node 120 being pulled to a logic one by inverter 106, which is formed by transistors 112 and 114. In some embodiments, BLB is also pulled high at the same time as BL is pulled low to further assist in writing the bitcell. The writing operation concludes at block 248 when the WL is transitioned from a logic one to a logic zero to respectively decoupled storage nodes 116 and 120 from the BL and BLB. The BL and BLB may also be coupled to the pre-charge voltage source such that BL and BLB are pre-charged to VDD or other pre-charge voltage.

Figure 2D:
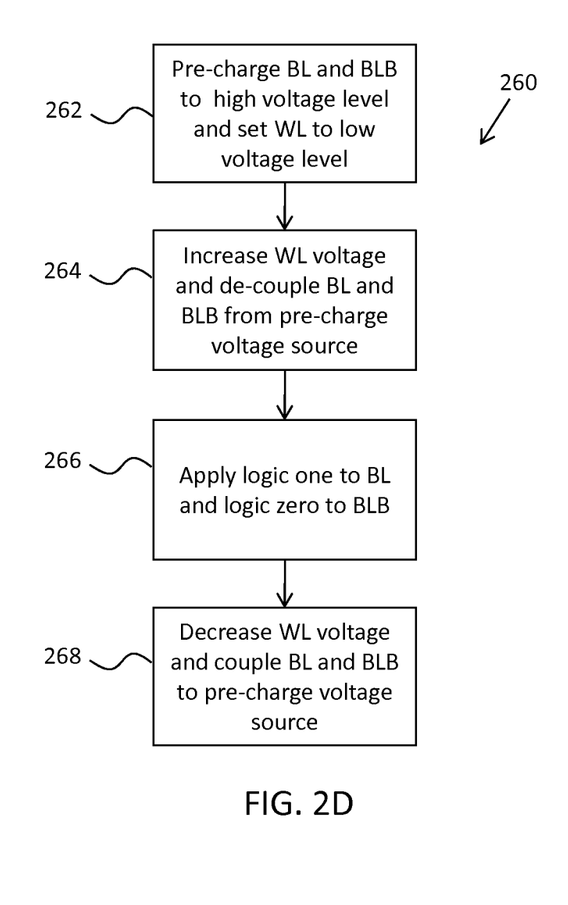
FIG. 2D is a flow diagram of one example of writing a logic one to a memory bit cell in accordance with FIG. 1A.

The writing of a logic one to node 116, which is equivalent to write a logic zero to node 120, is described with reference to FIG. 2D, which is a flow diagram of one example of a method 260 of such operation. At block 262, bit lines BL and BLB are pre-charged to high voltage levels, e.g., VDD, by the pre-charge voltage source (not shown), and WL is at a low voltage level, i.e., VSS. With the WL set at approximately VSS, pass transistors 118 and 122 are off due to their gate-source voltages, $V_{GS}$, being less than the turn-on or threshold voltages, $V_T$. Device 126 between node 124 and VSS increases the voltage of nodes 116 and 120 relative to VSS and results in the channel of pass transistors 118 and 122 being more off than if the voltage at nodes 116 and 120 were coupled to VSS. For example, if a logic zero is stored at storage node 120, then the voltage of node 120 is VSSarray, which is greater than VSS, and the voltage of node 116 is at VDD. Since VSSarray is greater than VSS, then transistor 122 is more 'off' than if the voltage at node 120 was at VSS.

At block 264, the voltage on WL is increased to VDD to turn on pass transistors 118 and 122, and BL and BLB are decoupled from the pre-charge voltage source (not shown).

At block 266, BLB is driven to a logic zero by the control logic (not shown), which is coupled to storage node 120 through pass transistor 122. The writing of the logic zero to node 120 may be assisted by the voltage at storage node 116 initially being elevated compared to VSS, i.e., being at voltage VSSarray. This results in a reduced Vgs for transistor 114, thus weakening the stored one logic state. Additionally, node 116 being elevated compared to VSS also weakens the stored zero side of the bitcell due to the reduced drive current of transistor 108 from a reduced Vgs value and also from an increased threshold voltage (Vt) caused by an elevated source compared to the bulk node (body effect). As a result, the voltage at storage node 116 being elevated compared to VSS enables the writing of a logic one to storage node 116 to be performed more quickly and/or over an increased range of power rail voltages, compared to having VSS stored at storage node 116.

The writing of a logic zero at node 120 results in storage node 116 being pulled to a logic one through by inverter 104, which is formed by transistors 108 and 110. In some embodiments, BL is also be pulled high at the same time as BLB is pulled low to further assist in writing the bitcell. The writing operation concludes at block 268 when the WL is transitioned from a logic one to a logic zero to respectively decoupled storage nodes 116 and 120 from the BL and BLB. The BL and BLB may also be coupled to the pre-charge voltage source such that BL and BLB are pre-charged to VDD or other pre-charge voltage.

Figure 3:
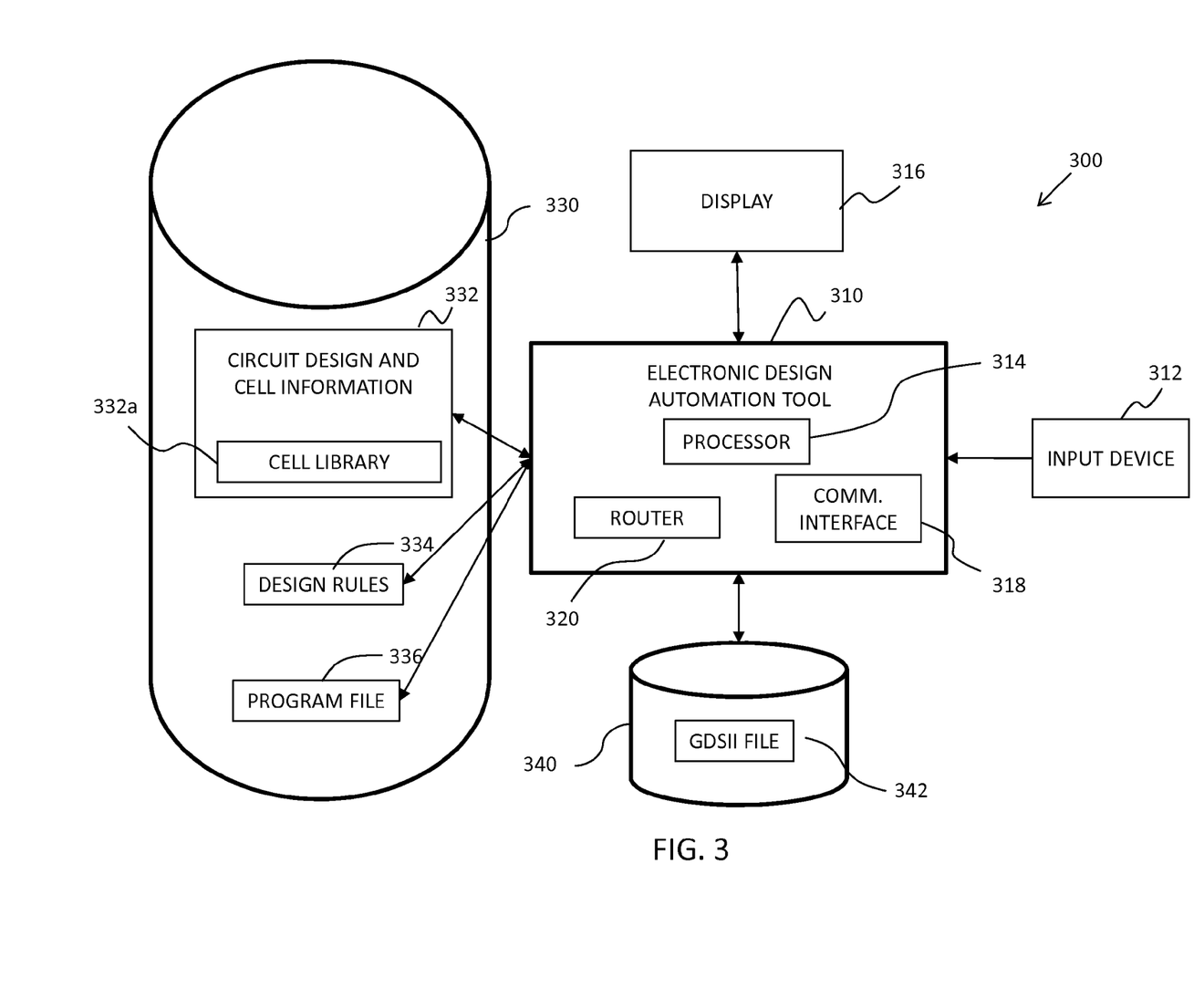
FIG. 3 is a block diagram of one example of a system configured to perform some or all of the method set forth in FIG. 4.

The improved SRAM memories described above may be designed using a system 300 such an electronic design automation ("EDA") tool 310 as illustrated in FIG. 3. An examples of an EDA tool 310 includes, but is not limited to, the "IC COMPILER"™, sold by Synopsis, Inc. of Mountain View, Calif., having a router 320 such as "ZROUTE"™, also sold by Synopsis. Other EDA tools 310 may be used, such as, for example, the " VIRTUOSO" custom design platform or the Cadence "ENCOUNTER"® digital IC design platform along with the "VIRTUOSO" chip assembly router 320, all sold by Cadence Design Systems, Inc. of San Jose, Calif.

EDA tool 310 is a special purpose computer formed by retrieving stored program instructions 336 from a non-transient computer readable storage medium 330, 340 and executing the instructions on a general purpose processor 314. Processor 314 may be any central processing unit (CPU), microprocessor, micro-controller, or computational device or circuit for executing instructions. The non-transient machine readable storage medium 330, 340 may be a flash memory, random access memory ("RAM"), read only memory ("ROM"), or other storage medium. Examples of RAMs include, but are not limited to, static RAM ("SRAM") and dynamic RAM ("DRAM"). ROMs include, but are not limited to, programmable ROM ("PROM"), electrically programmable ROM ("EPROM"), and electrically erasable programmable ROM ("EEPROM"), to name a few possibilities.

System 300 may include a display 316 and a user interface or input device 312 such as, for example, a mouse, a touch screen, a microphone, a trackball, a keyboard, or other device through which a user may input design and layout instructions to system 300. The one or more non-transient computer readable storage mediums 330, 340 may store data input by a user such as a circuit design and cell information 332, which may include a cell library 332a, design rules 334, one or more program files 336, and one or more graphical data system ("GDS") II files 342.

EDA tool 310 may also include a communication interface 318 allowing software and data to be transferred between EDA tool 310 and external devices. Examples of a communications interface 318 include, but are not limited to, a modem, an Ethernet card, a wireless network card, a Personal Computer Memory Card International Association ("PCM-CIA") slot and card, or the like. Software and data transferred via communications interface 218 may be in the form of signals, which may be electronic, electromagnetic, optical, or the like that are capable of being received by communications interface 318. These signals may be provided to communications interface 318 via a communications path (e.g., a channel), which may be implemented using wire, cable, fiber optics, a telephone line, a cellular link, a radio frequency ("RF") link and other communication channels.

Router 320 is capable of receiving an identification of a plurality of cells to be included in a circuit layout, including a list 332 of pairs of cells, selected from the cell library 332a, within the plurality of cells to be connected to each other. Design rules 334 may be used for a variety of processing technologies (e.g., technology greater than, less than, or equal to 32 nm). In some embodiments, the design rules 334 configure the router 320 to locate connecting lines and vias on a manufacturing grid. Other embodiments may allow the router to include off-grid connecting lines and/or vias in the layout.

Figure 4:
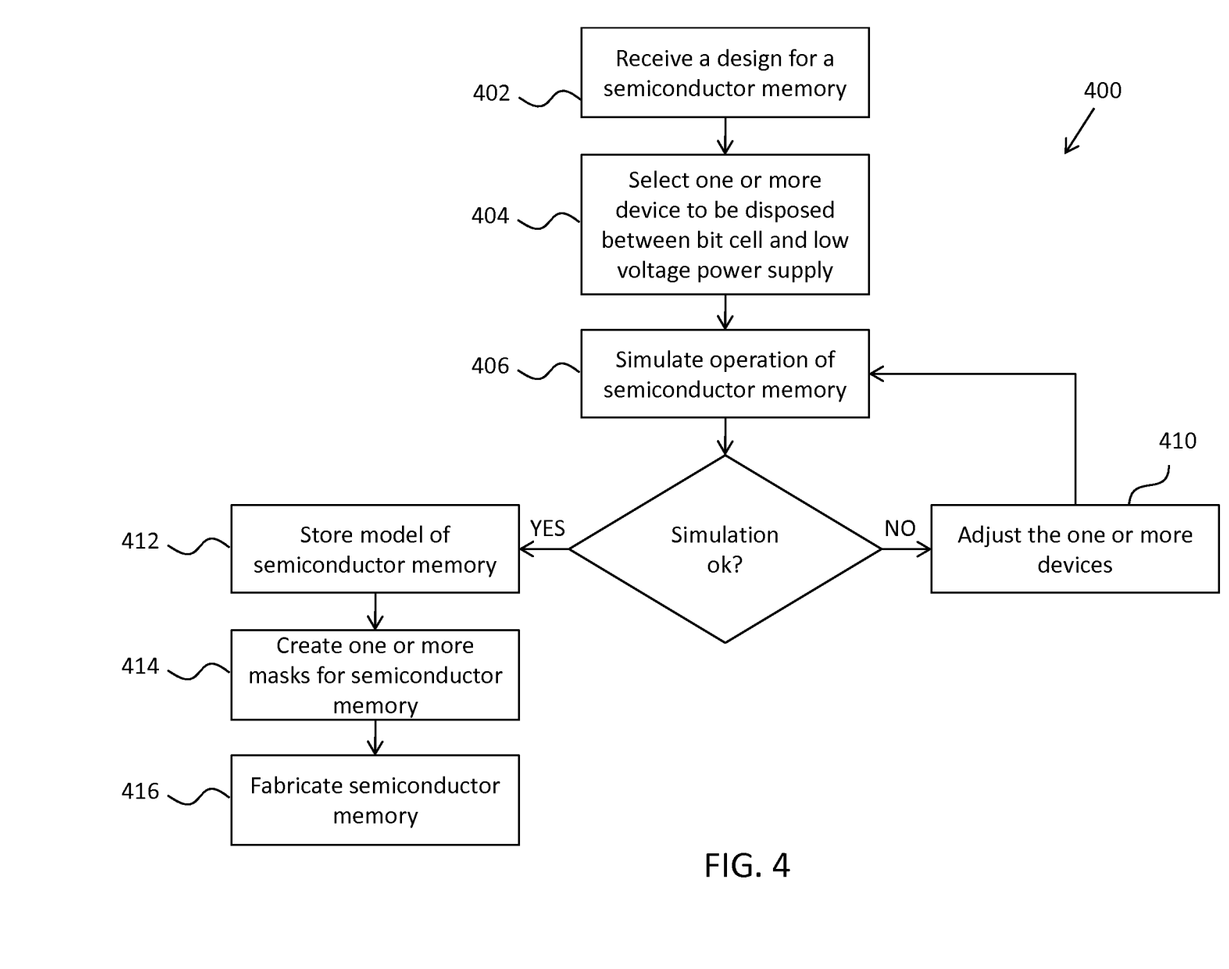
FIG. 4 is a flow diagram of one example of a method of designing and fabricating an improved semiconductor memory in accordance with FIGS. 1A and 1B.

FIG. 4 is a flow diagram of one example of a method 400 for designing an improved semiconductor memory in accordance with FIGS. 1A and 1B. At block 402, a design for a semiconductor memory 200 is received. The design may include a number of bit cells disposed in a column that is greater than or equal to 256 bit cells. In some embodiments, the number of bit cells in a column of the semiconductor memory is equal to 512 bit cells.

At block 404, one or more devices, e.g., device 126 and/or transistor 128, are selected to be disposed between a first bit cell and a low power supply line of the semiconductor memory. As will be understood by one skilled in the art, the selection of one or more device may include selecting a first type of the device(s) and a first size of the device(s).

A simulation of the proposed semiconductor memory is performed at block 406. The simulation may be performed using EDA tool 310 and may generate data approximating the performance of the semiconductor memory. In some embodiments, the simulation data includes a bit line read current and a bit line off current. As will be understood by one skilled in the art, the simulation may be performed for a range of operating voltages, operating temperatures, and processing parameters (i.e., a range of PVT variables).

At decision block 408, a determination is made if the sizing of the device enables a sufficient operation of the semiconductor memory. The determination may be made based on a ratio of the read current to off bit line current. For example, the simulated ratio of the read current to the off bit line current may be compared to a threshold ratio to determine if the size of the device is acceptable. In some embodiments, the threshold ratio is ten, but one skilled in the art will understand that other threshold ratios may be used.

If the simulation demonstrates that the operation of the semiconductor memory is not sufficient, e.g., the simulated ratio is less than the threshold, then the one or more devices, device 126 and/or transistor 128, are adjusted at block 412. For example, if the threshold ratio is greater than the simulated ratio, then the physical size of the device(s) may be adjusted such that a resistance of the device(s) are increased.

For example, a width and/or a length of the channel of the device may be adjusted in order to adjust a resistance of the device.

In some embodiments, the device may be adjusted by changing the manner in which the device is fabricated. For example, if the device is initially an NMOS transistor fabricated in accordance with the process used to fabricate the bit cell transistors of the semiconductor memory, then the device may be changed to an NMOS transistor fabricated in accordance with the process used to fabricate the transistor of the control or logic circuitry of the semiconductor memory. Alternatively, if the device is initially an NMOS transistor fabricated in accordance with the process used to fabricate the transistor of the control or logic circuitry of the semiconductor memory, then the NMOS transistor may be changed to an NMOS transistor fabricated in accordance with the process used to fabricate the bit cell transistors of the semiconductor memory.

The increased resistance of the device(s) increases the voltage of VSSarray, e.g., the voltage at node 124, to decrease the leakage current. The modified semiconductor memory is simulated again at block 406. In this manner, the design of the semiconductor memory may be iteratively determined.

Once it is determined that the simulation demonstrates that the semiconductor memory operates sufficiently, e.g., the simulated ratio is greater than or equal to the threshold ratio, then an electronic representation of a model of the semiconductor memory is stored in one or more non-transient computer readable storage medium 330, 340 at block 412. In some embodiments, the model may be stored as a graphical data system ("GDS") II file 342. One or more masks may be created for fabricating the semiconductor memory at block 216, and the semiconductor memory may be fabricated at block 418.

In some embodiments, a method includes a) selecting a number of bit cells per bit line to be included in a semiconductor memory; b) selecting a size of a device to be disposed between and coupled to a first memory bit cell and to a first power supply line; c) simulating a first design of the semiconductor memory that includes the device disposed between and coupled to the first memory bit cell and to the first power supply line; d) determining if at least one simulated operational value of the semiconductor memory is above a threshold value; e) adjusting at least one of the size of the device or a type of the device if the at least one simulated operational value is below the threshold value; f) repeating steps d) and e) until the at least one simulated operational value is at or above the threshold value; and g) storing a final model of the semiconductor memory in a non-transient computer readable storage medium when the at least one simulated operational value is at or above the threshold value. An initial size of the device is selected based on the number of bit cells in the column in which the first memory bit cell is disposed.

In some embodiments, a system includes a non-transient computer-readable storage medium and a processor in communication with the non-transient computer-readable storage medium. The processor is configured to a) receive a first design of a semiconductor memory that includes a first memory bit cell disposed in a column of memory bit cells in which a number of memory bit cells in the column is greater than 256 bit cells; b) receive a selection of at least one device having a size and a type; c) simulate the first design of the semiconductor memory; d) adjust at least one of the size of the device or the type of the device if at least one simulated operational value is below a threshold value; e) repeat steps c) and d) until at least one simulated operational value is at or above the threshold value; and e) store a final model of the semiconductor memory in the non-transient computer readable storage medium when the at least one simulated operational value is at or above the threshold value. The device is disposed between and coupled to the first memory bit cell and to a first power supply line.

In some embodiments, a non-transient computer-readable storage medium is encoded with program code, wherein when the program code is executed by a processor, the processor performs a method. The method includes a) receiving a first design of a semiconductor memory that includes a first memory bit cell disposed in a column of memory bit cells in which a number of memory bit cells in the column is greater than 256 bit cells; b) receiving a selection of at least one device having a size and a type; c) simulating the first design of the semiconductor memory; d) adjusting at least one of a size of the device or a type of the device if at least one simulated operational value is below a threshold value; and e) repeating steps c) and d) until a simulated operational value is above or below a threshold value. The device is disposed between and coupled to the first memory bit cell and to a first power supply line.

The disclosed circuits and systems and methods for designing and fabricating the circuits advantageously enable the number of memory bit cells in a column to be increased beyond 256 cells by reducing the leakage current experienced on a bit line. The improved semiconductor memories have increased density and improved efficiency compared to conventional semiconductor memories.

Although the systems has been described in terms of exemplary embodiments, they are not limited thereto. Rather, the appended claims should be construed broadly, to include other variants and embodiments of the systems and methods, which may be made by those skilled in the art without departing from the scope and range of equivalents of the systems and methods. Delimiters used in the claims—such as 'a)' and 'i)'—and should not be taken as imputing any order to the claims, but rather are provided only to serve as visual cues to add in the parsing of the claims and as identifiers in the event that a particular portion of the claim is to be later referenced.

What is claimed is:

1. A method, comprising:
   a) selecting a number of bit cells per bit line to be included in a semiconductor memory;
   b) selecting a size of a device to be disposed between and coupled to a first memory bit cell and to a first power supply line, the size based on the number of bit cells;
   c) simulating a first design of the semiconductor memory that includes the device disposed between and coupled to the first memory bit cell and to the first power supply line, the first memory bit cell disposed in a column including the selected number of bit cells;
   d) determining if at least one simulated operational value of the semiconductor memory is above a threshold value;
   e) adjusting at least one of the size of the device or a type of the device if the at least one simulated operational value is below the threshold value;
   f) repeating steps d) and e) until the at least one simulated operational value is at or above the threshold value; and
   g) storing a final model of the semiconductor memory in a non-transient computer readable storage medium when the at least one simulated operational value is at or above the threshold value,
   wherein the semiconductor memory includes a transistor coupled in parallel with the device, the transistor including a drain coupled to a node disposed between the first memory bit cell and the device, a source coupled to the first power supply line, and a gate configured to receive a control signal to selectively turn the transistor on and off based on a voltage on a word line to which the first memory bit cell is coupled.

2. The method of claim 1, further comprising:
h) creating at least one mask based on the model; and
i) fabricating the semiconductor memory using the mask.

3. The method of claim 1, wherein the number of bit cells per bit line is greater than or equal to 256 bit cells.

4. The method of claim 1, wherein the device is one of a resistor or a transistor.

5. The method of claim 1, wherein the device is a transistor and adjusting the type of the device includes changing the transistor from a transistor of a first type to a transistor of a second type.

6. The method of claim 5, wherein the transistor of the first type is a transistor fabricated by a first process and the transistor of the second type is a transistor fabricated by a second process, the process of the first type being different than the process of the second type.

7. The method of claim 1, wherein the semiconductor memory includes a tracking column including at least one tracking bit cell coupled to a second power supply line and to the device.

8. The method of claim 1, wherein the at least one simulated operational value includes a ratio of a bit line read current to a current of the bit line when each pass gate coupled to the memory bit cells coupled to a bit line are in an off state.

9. A system, comprising:
a non-transient computer-readable storage medium; and
a processor in communication with the non-transient computer-readable storage medium, the processor configured to
a) receive a first design of a semiconductor memory that includes a first memory bit cell disposed in a column of memory bit cells in which a number of memory bit cells in the column is greater than 256 bit cells;
b) receive a selection of at least one device having a size and a type, the device disposed between and coupled to the first memory bit cell and to a first power supply line;
c) simulate the first design of the semiconductor memory;
d) adjust at least one of the size of the device or the type of the device if at least one simulated operational value is below a threshold value;
e) repeat steps c) and d) until the at least one simulated operational value is at or above the threshold value; and
f) store a final model of the semiconductor memory in the non-transient computer readable storage medium when the at least one simulated operational value is at or above the threshold value,
wherein the semiconductor memory includes a transistor coupled in parallel with the device, the transistor including a drain coupled to a node disposed between the first memory bit cell and the device, a source coupled to the first power supply line, and a gate configured to receive a control signal to selectively turn the transistor on and off based on a voltage on a word line to which the first memory bit cell is coupled.

10. The system of claim 9, wherein the device is one of a resistor or a transistor.

11. The system of claim 9, wherein the device is a transistor and adjusting the type of the device includes changing the transistor from a transistor of a first type to a transistor of a second type.

12. The system of claim 11, wherein the transistor of the first type is a transistor fabricated by a first process and the transistor of the second type is a transistor fabricated by a second process, the process of the first type being different than the process of the second type.

13. The system of claim 9, wherein the semiconductor memory includes a tracking column including at least one tracking bit cell coupled to a second power supply line and to the device.

14. The system of claim 9, wherein the at least one simulated operational value includes a ratio of a bit line read current to a current of the bit line when each pass gate coupled to the memory bit cells in the column of memory bit cells are in an off state.

15. A non-transient computer-readable storage medium encoded with program code, wherein when the program code is executed by a processor, the processor performs a method, the method comprising:
a) receiving a first design of a semiconductor memory that includes a first memory bit cell disposed in a column of memory bit cells in which a number of memory bit cells in the column is greater than 256 bit cells;
b) receiving a selection of at least one device having a size and a type, the device disposed between and coupled to the first memory bit cell and to a first power supply line;
c) simulating the first design of the semiconductor memory;
d) adjusting at least one of a size of the device or a type of the device if at least one simulated operational value is below a threshold value;
e) repeating steps c) and d) until a simulated operational value is above or below a threshold value; and
f) storing a final model of the semiconductor memory in a non-transient computer readable storage medium. When the at least one simulated operational value is at or above the threshold value,
wherein the semiconductor memory includes a transistor coupled in parallel with the device, the transistor including a drain coupled to a node disposed between the first memory bit cell and the device, a source coupled to the first power supply line, and a gate configured to receive a control signal to selectively turn the transistor on and off based on a voltage on a word line to which the first memory bit cell is coupled.

16. The non-transient computer-readable storage medium of claim 15, wherein the device is a transistor and adjusting the type of the device includes changing the transistor from a transistor of a first type to a transistor of a second type.

17. The non-transient computer-readable storage medium of claim 16, wherein the transistor of the first type is a transistor fabricated by a first process and the transistor of the second type is a transistor fabricated by a second process, the process of the first type being different than the process of the second type.

18. The non-transient computer-readable storage medium of claim 15, wherein the semiconductor memory includes a tracking column including at least one tracking bit cell coupled to a second power supply line and to the device.

19. The non-transient computer-readable storage medium of claim 15, wherein the at least one simulated operational value includes a ratio of a bit line read current to a current of the bit line when each pass gate coupled to the memory bit cells in the column of memory bit cells are in an off state.

* * * * *

UNITED STATES PATENT AND TRADEMARK OFFICE
CERTIFICATE OF CORRECTION

PATENT NO.       : 8,522,174 B2
APPLICATION NO.  : 13/362117
DATED            : August 27, 2013
INVENTOR(S)      : Bryan David Sheffield Page 1 of 1

It is certified that error appears in the above-identified patent and that said Letters Patent is hereby corrected as shown below:

In the Claims:

Claim 15, Column 12, Line 35, delete ". When" and insert --when--

Signed and Sealed this
Ninth Day of September, 2014

Michelle K. Lee
*Deputy Director of the United States Patent and Trademark Office*